(12) United States Patent
Tomimatu

(10) Patent No.: US 6,338,925 B1
(45) Date of Patent: Jan. 15, 2002

(54) PHOTOLITHOGRAPHY PROCESSING BASED ON FRESH CALIBRATION PARAMETER VALUES

(75) Inventor: Yoshikatu Tomimatu, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/617,819

(22) Filed: Jul. 17, 2000

(30) Foreign Application Priority Data

Jan. 14, 2000 (JP) .......................................... 12-006550

(51) Int. Cl.$^7$ ................................................. G03F 9/00
(52) U.S. Cl. ........................................................ 430/30
(58) Field of Search ................................... 430/30, 311

Primary Examiner—Christopher G. Young
(74) Attorney, Agent, or Firm—McDermott, Will & Emery

(57) ABSTRACT

The object of the present invention is to provide a photolithography process for use in the photolithography system compensated based upon the calibrating parameter values which are fresh and not obsolete, by determining whether a predetermined time period expires from the time when the calibrating parameter values are obtained until the time when an actual production lot is processed, and by updating the calibrating parameter values if they are obsolete.

12 Claims, 6 Drawing Sheets

US 6,338,925 B1

PHOTOLITHOGRAPHY PROCESSING BASED ON FRESH CALIBRATION PARAMETER VALUES

BACKGROUND OF THE INVENTION

The present invention relates to a photolithography process for a plurality of production lots of semiconductor wafers. In particular, the present invention relates to a photolithography process for use in a photolithography system compensated based upon calibrating parameter values that are calculated by precedently processing some sample wafers.

A semiconductor device with a desired circuit is manufactured by photolithography processing (masking, exposing, and developing) a semiconductor wafer, repeatedly, with predetermined photoresists. Such photolithography processes require a more exact control for overlapping the subsequent photoresists, as increasing the density of circuits integrated into the semiconductor wafers. In particular, in case where the manufacturing process of the semiconductor wafer needs many photolithography processes, it is critical to precisely align each of subsequent photoresists patterns with the preformed pattern on the semiconductor wafer, in order to achieve a high productivity of large-scale integrated semiconductor devices. Therefore, the photolithography system should be properly maintained to precisely align each of the photoresist patterns with the preformed pattern on the semiconductor wafer, whenever the photolithography system is utilized.

By the way, the photolithography system is a highly organized and sophisticated system comprising a plurality of components (or subsystems) such as a focus subsystem and a stage subsystem. Therefore, in order to achieve a precise alignment of the photoresist patterns one another, the photolithography system should be compensated by adjusting several components properly and simultaneously. For example, a light source and/or a stage are vertically adjusted so that the distance between the light source and the stage is a focal length for obtaining a sharp image of the photoresist pattern on the semiconductor wafer, or the stage is controlled so that each of lateral displacements of the stage corresponds to a pitch between devices on a wafer. Thus, each of the components of the photolithography system has parameters to be adjusted for the precise alignment. Further, since such parameters generally deviate from their proper values as the time goes by, they should be calibrated to their proper values for maintaining the photolithography system so as to achieve the precise alignment. One solution for the precise alignment is well known as a precedent process. In the precedent process, firstly, some sample wafers in a production lot are picked and actually processed using the photolithography system prior to processing the other wafers, for obtaining the proper parameter values of the photolithography system. Then, the photolithography system is compensated based upon the proper parameter values to process the other wafers. In the present specification, a series of those processes and the sample wafers are referred to hereinafter as a "precedent process" and "precedently processed sample wafers", respectively.

As described above, since the photolithography system is a highly organized system comprising many components (subsystems), the proper parameter values for achieving the precise alignment are co-relating to one another. Also, the proper parameter values depend upon the configurations and dimensions of the devices and/or wafers to be processed, including the height of the alignment mark of the device and the lateral device pitch on the wafer as indicated above. Therefore, the precedent process for achieving the precise alignment may be preferably conducted using the same photolithography system as well as the same type of sample wafers as ones in an actual production lot.

However, even where the precedent process is conducted using the same photolithography system and the same type of sample wafers as actual ones, as the times goes by, the actual parameter values are deviated or varied from the proper ones to be obsolete, as described above. Therefore, the parameter values should be calibrated to the proper parameter ones for the precise alignment, accordingly.

Referring to FIGS. 5 and 6, the details of a conventional photolithography process are described hereinafter. As shown in FIG. 5, in step 101, any one of the wafers in the production lot is picked and precedently processed to calculate the calibrating values which are deviation values from the proper parameter values of the photolithography system, that is referred to simply as the "calibrating values". In step 102, the mother production lot from which the wafer is sampled is processed with the photolithography system based upon the calculated calibrating values. In step 103, the sample wafer used for the precedent process is simply destroyed or recovered as it used to be before the sample wafer is precedently processed. According to the present invention, the recovering process is referred to as a "recovery process", hereinafter. To improve the productivity, the sample wafer is preferably recovered. However, when the sample wafer is recovered and brought back to the mother production lot, it is necessary to await the sample wafer being recovered, which takes approximately 6 through 12 hours, and then to restart the subsequent processes for the mother production lot.

Contrary to this, an another approach is suggested that the recovered samples are dropped out from (not brought back to) the mother production lot, which are referred to as "off-wafers", but such off-wafers are gathered to form a new production lot to be processed. However, according to this approach, the manufacturing process of the semiconductor wafers comprises more photolithography processes each requiring the precedent process, more off-wafers are produced and, eventually, more precedent processes are necessary, inconveniently resulting in the low productivity. In step 104, any of wafers sampled from the lot processed by the photolithography system are tested or inspected (spot-checked). Thus, a series of photolithography process is completed.

An another conventional photolithography process improving the aforementioned process is illustrated in FIG. 6. In this process, only the very first production lot is processed as described above in order to obtain the calibrating values for compensating the photolithography system. Then, in step 111, for the second and following production lots, the photolithography system is compensated based upon the calibrating values calculated when the prior production lot has been processed, rather than based upon the calibrating values calculated by precedently processing sampled wafers. In step 112, the second or following production lot is processed with the photolithography system compensated based upon the calibrating value calculated during processing the prior production lot. Then, in step 113, a new calibrating value is calculated for the next production lot. In other words, in steps 111 through 113, the new calibrating values are calculated and fed back into the next photolithography process. Thus, according to this conventional photolithography process, the calibrating values are updated always as a production lot is processed, and it is not necessary to await the wafers recovered nor to abandon the off-wafers. This approach is particularly advantageous for devices, which are often manufactured (large numbers of devices or production lots), such as DRAMs since the calibrating values are often updated.

On contrary to this, if this approach is used for devices, which are seldom manufactured (small numbers of devices or production lots), such as ASICs, this would cause a problem. That is, after the calibrating parameter values of the photolithography system is updated for the next production lot, a substantial time period, for example, a several weeks may pass until the calibrating parameter values is actually "fed back" into the next production lot. As described above, the actual parameter values generally deviate from the proper ones for the precise alignment of the photoresist patterns, as the time goes by. Therefore, such calibrating parameter values are too obsolete to feed back into the next production lot. In fact, the calibrating parameter values will be obsolete and should be evaluated again in a different way, after a predetermined time period (for example 24 hours) has passed, in which the calibrating parameter values secure to compensate the system of the photolithography system.

SUMMARY OF THE INVENTION

Therefore, the present invention addresses the problems as aforementioned and the first object of the present invention is to provide a photolithography process for use in the photolithography system compensated based upon the calibrating parameter values which are fresh and not obsolete, by determining whether a predetermined time period expires from the time when the calibrating parameter values are obtained until the time when an actual production lot is processed, and by updating the calibrating parameter values if they are obsolete.

The second object of the present invention is to provide a photolithography process for use in the photolithography system compensated based upon the calibrating parameter values, in which the alignment accuracy of photoresists can be selectively adjusted by arbitrarily choosing the predetermined time period.

The third object of the present invention is to provide a photolithography process for use in the photolithography system compensated based upon the calibrating parameter values, in which the mother production lot are processed without a hitch, i.e., without a need for awaiting the precedently processed wafers recovered.

The fourth object of the present invention is to provide a photolithography process for use in the photolithography system compensated based upon the calibrating parameter values, in which off-wafers are minimized in number to achieve the maximum productivity.

The photolithography process of first aspect according to the present invention, in which a production lot having a plurality of semiconductor wafers is processed with a photolithography system compensated based upon calibrating parameter values obtained in a precedent process, comprises steps of: a) precedently processing at least one of first lot wafers sampled from a first production lot so as to obtaining first calibrating parameter values; b) calculating a time period ($T_m$) after obtaining the first calibrating parameter values until processing an m-th production lot (m is a natural number of more than 2); c-1) if the time period ($T_m$) does not exceed a predetermined time period ($T_s$), processing the m-th production lot with the photolithography system compensated based upon the first calibrating parameter values; and c-2) if the time period ($T_m$) exceeds the predetermined time period ($T_s$), keeping at least one of m-th lot wafers sampled from the m-th production lot, precedently processing the first lot wafers again which is recovered so as to obtain m-th calibrating parameter values, and processing the m-th production lot with the photolithography system compensated based upon the m-th calibrating parameter values.

In the photolithography process according to the present invention, if the time period ($T_m$) exceeds the predetermined time period ($T_s$), the m-th production lot is processed with the photolithography system compensated based upon the m-th calibrating parameter values within the predetermined time period ($T_s$) after obtaining the m-th calibrating parameter values.

In the photolithography process according to the present invention, if the time period ($T_m$) exceeds the predetermined time period ($T_s$), further comprises steps of:

twice recovering the first lot wafers; and incorporating the first lot wafers into the m-th production lot.

The photolithography process according to the present invention, further comprises a step of: conducting a sampling inspection for the m-th production lot by sampling at least one of the former first lot samples which are incorporated into the m-th production lot.

The photolithography process of second aspect according to the present invention, further comprises steps of: d) calculating a time period ($T_n$) after obtaining the m-th calibrating parameter values until processing an n-th production lot (n is a natural number of more than 3); e-1) if the time period ($T_n$) does not exceed the predetermined time period ($T_s$), processing the n-th production lot with the photolithography system compensated based upon the m-th calibrating parameter values; and e-2) if the time period ($T_n$) exceeds a predetermined time period ($T_s$), keeping at least one of n-th lot wafers sampled from the n-th production lot, precedently processing the m-th lot wafers so as to obtain n-th calibrating parameter values, and processing the n-th production lot with the photolithography system compensated based upon the n-th calibrating parameter values.

In the photolithography process according to the present invention, if the time period ($T_n$) exceeds the predetermined time period ($T_s$), the n-th production lot is processed with the photolithography system compensated based upon the n-th calibrating parameter values within the predetermined time period ($T_s$) after obtaining the n-th calibrating parameter values.

In the photolithography process according to the present invention, if the time period ($T_n$) exceeds the predetermined time period ($T_s$), further comprises steps of: recovering the m-th lot wafers; and incorporating the m-th lot wafers into the n-th production lot.

The photolithography process according to the present invention, further comprises a step of: conducting a sampling inspection for the n-th production lot by sampling at least one of the former m-th lot samples which are incorporated into the n-th production lot.

A photolithography process of third aspect according to the present invention, in which a production lot having a plurality of semiconductor wafers is processed with a photolithography system compensated based upon calibrating parameter values obtained in a precedent process, comprises steps of: a) processing an n-th production lot (n is a natural number of more than 3) with a photolithography system compensated based upon n-th calibrating parameter values, which are obtained by precedently processing an m-th production lot (m is a natural number of more than 2) b)

keeping at least one of n-th lot wafers sampled from the n-th production lot; c) calculating a time period ($T_k$) after obtaining the n-th calibrating parameter values until processing a k-th production lot (k is a natural number of more than 4); d-1) if the time period ($T_k$) does not exceed a predetermined time period ($T_s$), processing the k-th production lot with the photolithography system compensated based upon the n-th calibrating parameter values; and c-2 ) if the time period ($T_k$) exceeds the predetermined time period ($T_s$), keeping at least one of k-th lot wafers sampled from the k-th production lot, precedently processing the n-th lot wafers to obtain k-th calibrating parameter values, and processing the k-th production lot with the photolithography system compensated based upon the k-th calibrating parameter values.

In the photolithography process according to the present invention, if the time period ($T_k$) exceeds the predetermined time period ($T_s$), wherein the k-th production lot is processed with the photolithography system compensated based upon the k-th calibrating parameter values within the predetermined time period ($T_s$) after obtaining the k-th calibrating parameter values.

In the photolithography process according to the present invention, if the time period ($T_k$) exceeds the predetermined time period ($T_s$), further comprises steps of: recovering the n-th lot wafers; and incorporating the n-th lot wafers into the k-th production lot.

The photolithography process according to the present invention further comprises a step of: conducting a sampling inspection for the k-th production lot by sampling at least one of the former n-th lot samples which are incorporated into the k-th production lot.

Further scope of applicability of the present invention will become apparent from the detailed description given hereinafter. However it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention become more fully understood from the detailed description given hereinafter and accompanying drawings which are given by way of illustration only, and thus are not limitative of the present invention and wherein.

DETAILED DESCRIPTION OF THE PREFERRED EMBODIMENTS

With reference to FIGS. 1 through 4, a photolithography process according to the embodiment of the present invention is described hereinafter. As shown in the block diagram of FIG. 1, a managing system for the photolithography process of the present invention basically includes a host computer 1 for scheduling and managing the each of the photolithography processes. This host computer 1 is electrically linked, via LAN or the like, to a terminal 2 with a display and each of the photolithography processes 3, 4, and 5. Information regarding to a progress and/or a status of each of the lines is gathered to the host computer 1 and stored therein. Then, the operator can refer those informations through the terminal 2 to plan an efficient production schedule. Thus, the operator can monitor, at any time, the progress and/or the status of each of the photolithography processes including the completing time of each of the photolithography processes, which have been stored in the host computer 1.

In general, the production lots are basically divided into initial lots that are produced at the beginning as a new model, and subsequent normal lots. For clear understandings, the production lots will be divided into a first lot, an m-th lot and an n-th lot. The m-th lot and the n-th lot are the subsequent lots after the first lot, wherein m>n, and m and n are the natural numbers.)

(1) The First Production Lot

Figure 1:
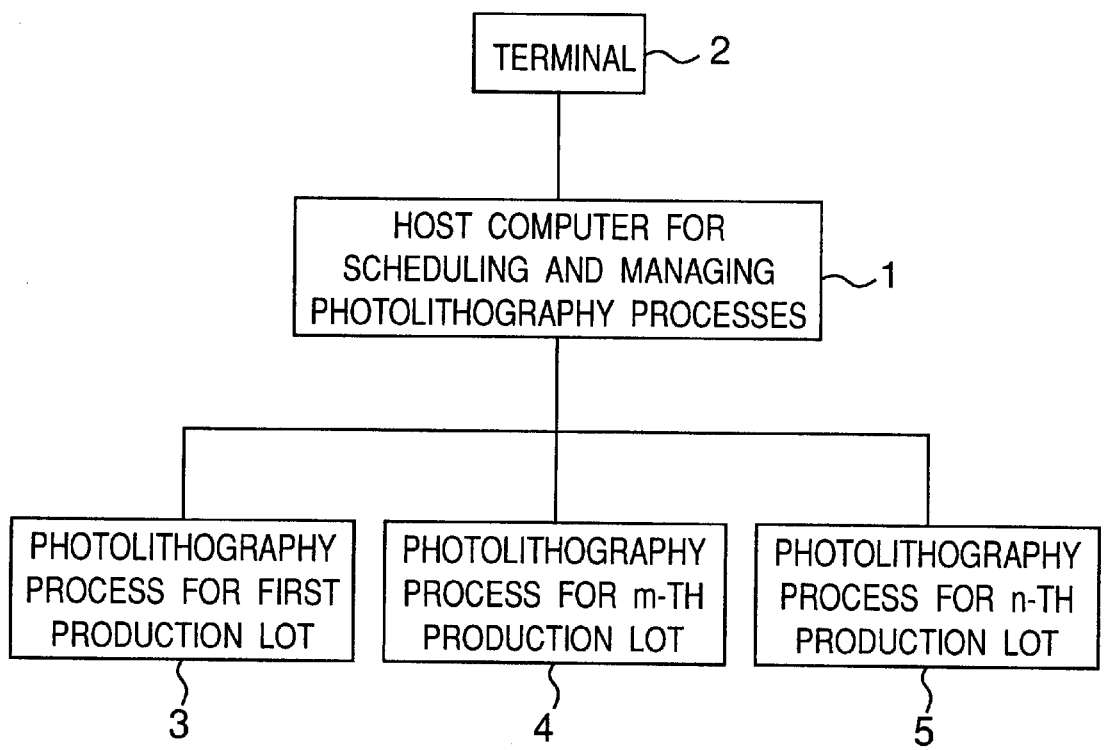
FIG. 1 is a block diagram of a managing system for the photolithography process of the present invention.
Figure 2:
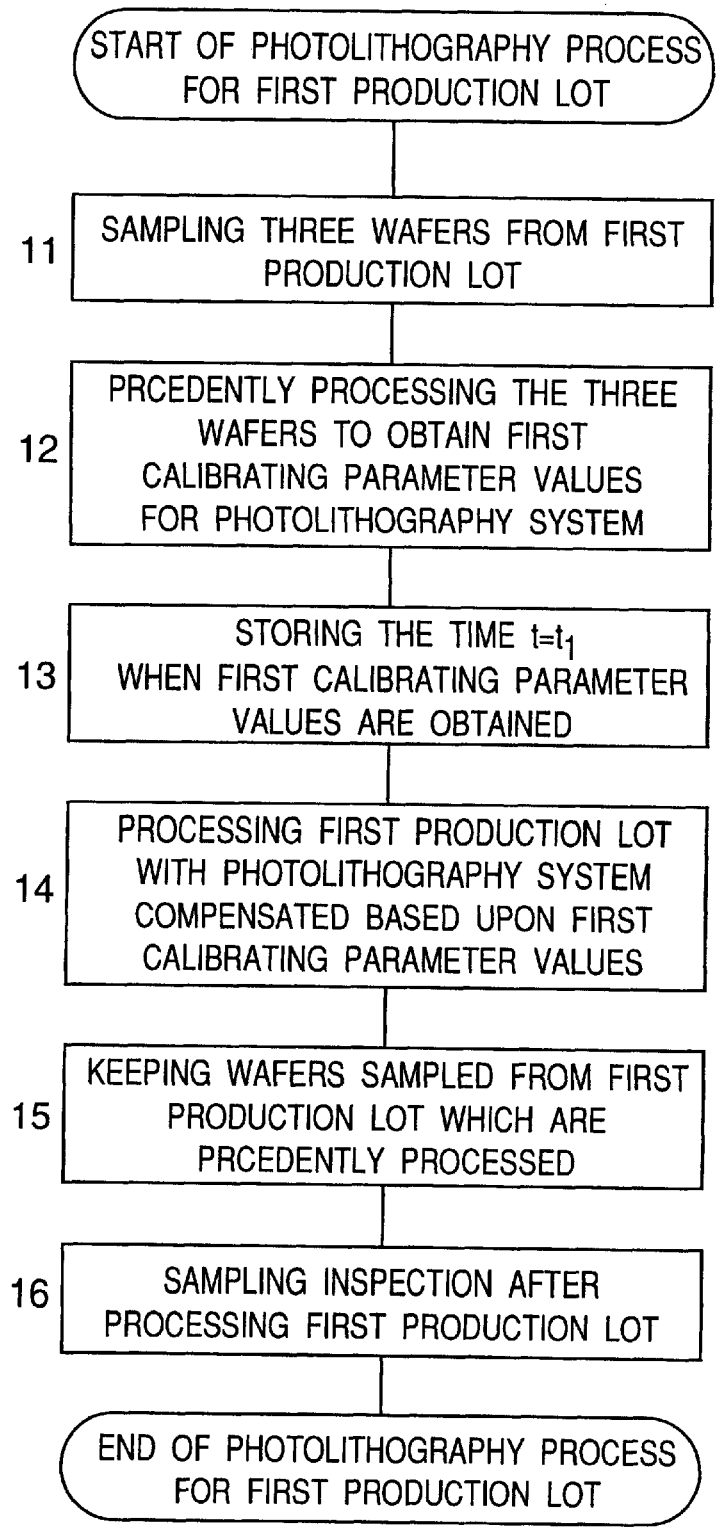
FIG. 2 is a flow chart of a photolithography process for a first production lot according to the present invention.

Referring to FIG. 2, the details of the photolithography process for the first production lot are described hereinafter. In step 11, three wafers (pilot-wafers) in the first production lot are arbitrarily sampled. In step 12, the first lot sampled wafers are precedently processed with a photolithography system to calculate a first calibrating parameter values. In step 13, the time ($t=t_1$) when the first calibrating parameter values are calculated, and the first calibrating parameter values are stored in the host computer 1. In step 14, the photolithography system is compensated based upon the first calibrating parameter values calculated in step 12, and then is used for processing wafers in the first lot (mother lot) except the sampled wafers. In step 15, the first lot sampled wafers are just stocked without being recovered so that the first mother lot should take no time for the first lot sampled wafers. In step 16, a normal sampling inspection (spot check) is conducted for the first mother lot. Thus, a series of the photolithography process is completed.

(2) The m-th Production Lot

Figure 3:
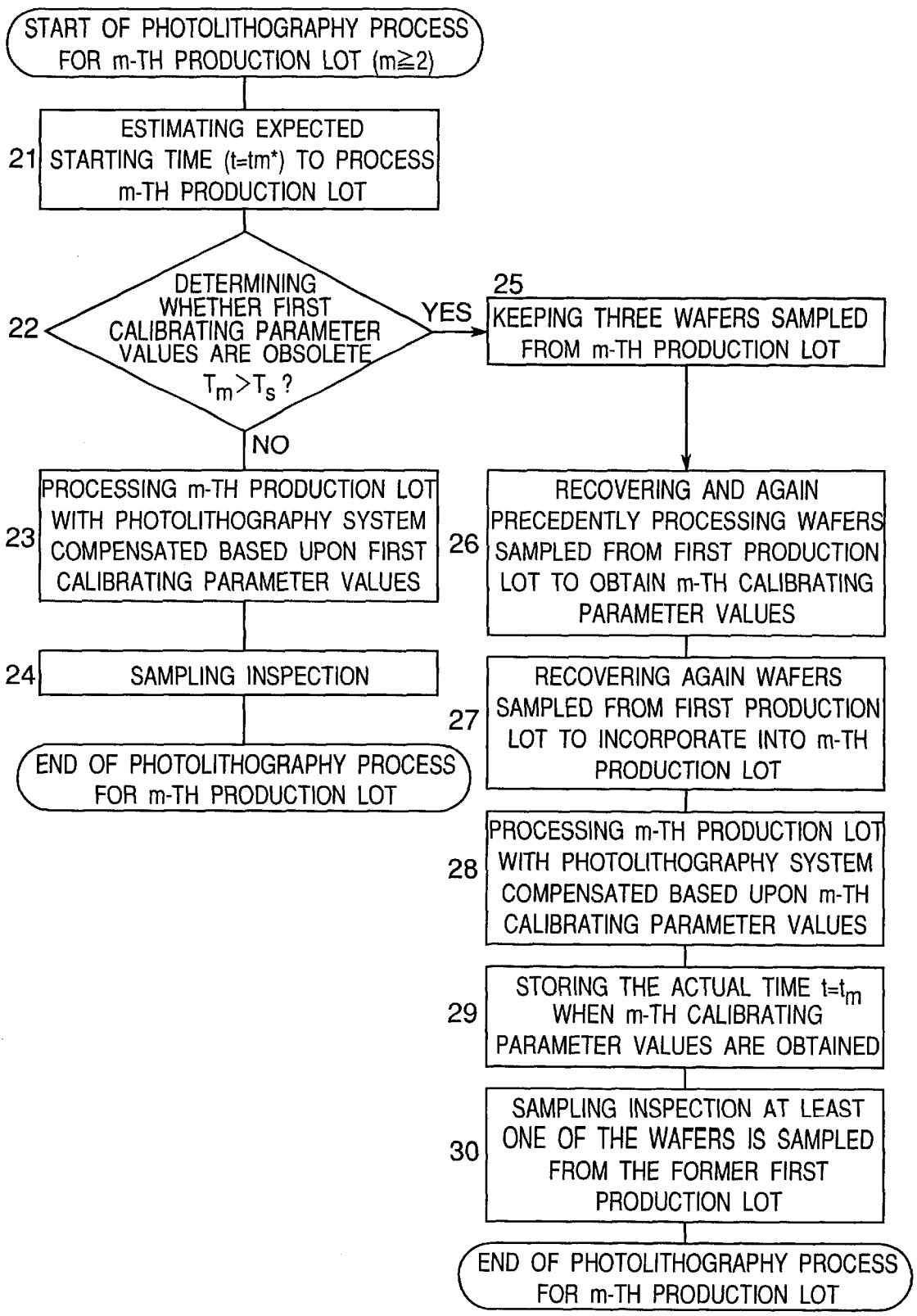
FIG. 3 is a flow chart of a photolithography process for an m-th production lot according to the present invention.

Referring to FIG. 3, the details of the photolithography process for the m-th production lot are described hereinafter. In step 21, the operator refers the host computer 1 through the terminal 2 to estimate the expected starting time to process the math production lot ($t=t_{m*}$: the suffix "*" is added in order to differentiate the expected starting time from an actual starting time as described later.) Also, in step 21, the operator calculates the time period $T_m$ ($T_m=t_{m*}-t_1$) from the time ($t=t_1$) when the first calibrating parameter values are calculated to the expected starting time to process the m-th production lot ($t=t_{m*}$) The time period $T_m$ ($T_m=t_{m*}-t_1$) will be referred to herein as a "life period" of the calibrating parameter values against the m-th production lot.

As described above, the longer life period of the calibrating parameter values causes the values more obsolete. If the maximum time period which secures the calibrating parameter values not to be obsolete, is defined as "the longest securing time period", which may be, for example, 24 hours. In step 22, the operator can determine that the first calibrating parameter values will be obsolete in case where the life period $T_m$ is longer than the longest securing time period. Also, in case where the calibrating parameter values are required to be more severe or more precise, a shorter time period than the longest securing time period may be defined as "the appropriate updating time period", which may be, for example, 12 hours. In step 22, the operator may determine that the calibrating parameter values will be obsolete in case where the life period $T_m$ is longer than the appropriate updating time period. In any cases, the operator can choose any criteria to determine whether the calibrating parameter values are obsolete or not, by arbitrarily setting a predetermined time period $T_s$ to be compared with the life time $T_m$. The calibrating parameter values which are determined to be obsolete are updated as shown in step 26 and thereafter.

In case where the calibrating parameter values are determined not to be obsolete ($T_m \leq T_s$: in case of NO), in step 23, the m-th production lot is processed with the photolithography system compensated based upon the first calibrating parameter values. In step 24, a normal sampling inspection is conducted for the processed m-th production lot to achieve a series of the photolithography process.

On the other hand, in case where the calibrating parameter values are determined to be obsolete ($T_m > T_s$: in case of YES), in step 25, three wafers in the m-th production lot are sampled. These samples are stocked in order to obtain the calibrating parameter values for a future production lot as will be described hereinafter.

The aforementioned predetermined time period $T_s$ such as the longest securing time period, and a time period $T_r$ necessary for the wafers to be recovered, are constant and to be, for example, 24 hours and 12 hours, respectively. Therefore, $T_s$ and $T_r$ presumably have a relation expressed in a following equation, i.e., $T_s = 2 \times T_r$, in step 22, the first calibrating parameter values may be determined to be obsolete, if $T_m > 2 \times T_r$. Further, the predetermined time period $T_s$ and the recovery time period $T_r$ may have a relation expressed in a following general equation, i.e., $T_s = k \times T_r$, while k can be calculated based upon the $T_s$ and $T_r$ of the sampled wafers. For example, if $T_s$: is 24 hours and $T_r$ is 6 hours, then k is 4. If k is calculated in advance, in step 22, the first calibrating parameter values may be determined to be obsolete, if $T_m > k \times T_s$.

In step 26, since the first calibrating parameter values are determined obsolete, they are updated to the m-th calibrating parameter values. In particular, the first lot sampled wafers stocked in step 15 are recovered and again precedently processed to obtain the m-th calibrating parameter values. It is clear for the persons skilled in the art that the m-th calibrating parameter values should be obtained so that they are not obsolete at the time of the expected starting time for processing the m-th production lot ($t = t_{m*}$) Preferably, a series of the steps for obtaining the m-th calibrating parameter values should be started later as possible so as to be completed just before the expected starting time ($t = t_{m*}$). It is noted that since the longest securing time period is longer than the recovery time period $T_r$ (for example, 6 hours and 12 hours), the m-th production lot is processed without a hitch if the series of the steps for obtaining the m-th calibrating parameter values is started once the first calibrating parameter values are determined obsolete.

In step 27, the first lot sampled wafers are twice recovered and then incorporated into the m-th production lot. In step 28, the m-th production lot is processed with the photolithography system compensated by the m-th calibrating parameter values. In step 29, the actual starting time to process the m-th production lot ($t = t_m$) is stored in the host computer 1.

After the m-th production lot is processed, in step 30, a sampling test is conducted for the m-th production lot. In the normal sampling inspection, arbitrary several wafers are sampled, but according to the present invention, at least one of the wafers is sampled from the former first production lot for testing the m-th production lot. Thus, not only the wafers processed trough a normal process (without being precedently processed) but also the wafers processed through a special process (with being precedently processed) are evaluated to assure the quality. Thus, a series of photolithography process for the m-th production lot are completed.

(3) The n-th Production Lot

Figure 4:
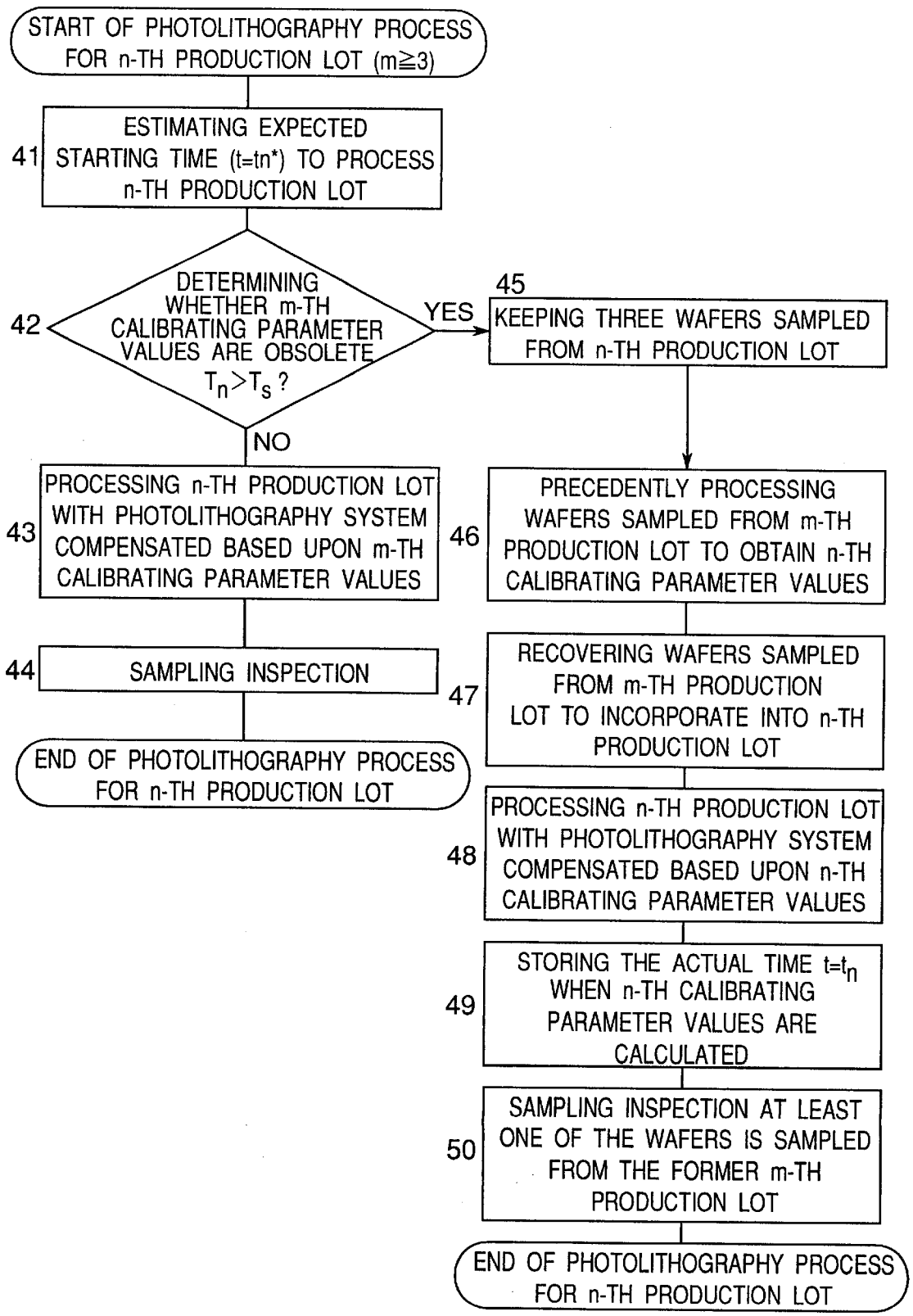
FIG. 4 is a flow chart of a photolithography process for an n-th production lot according to the present invention.
Figure 5:
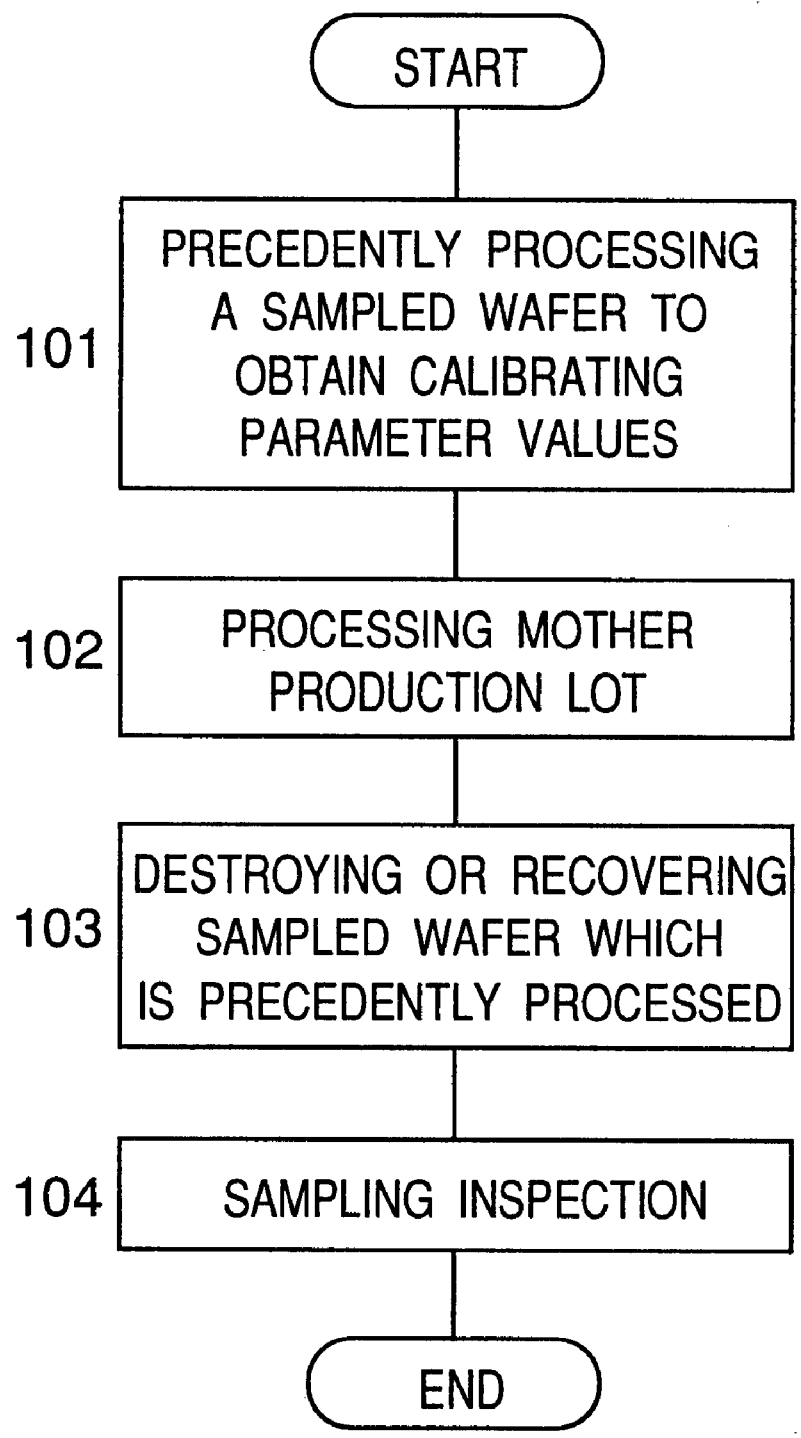
FIG. 5 is a flow chart of a conventional photolithography process.
Figure 6:
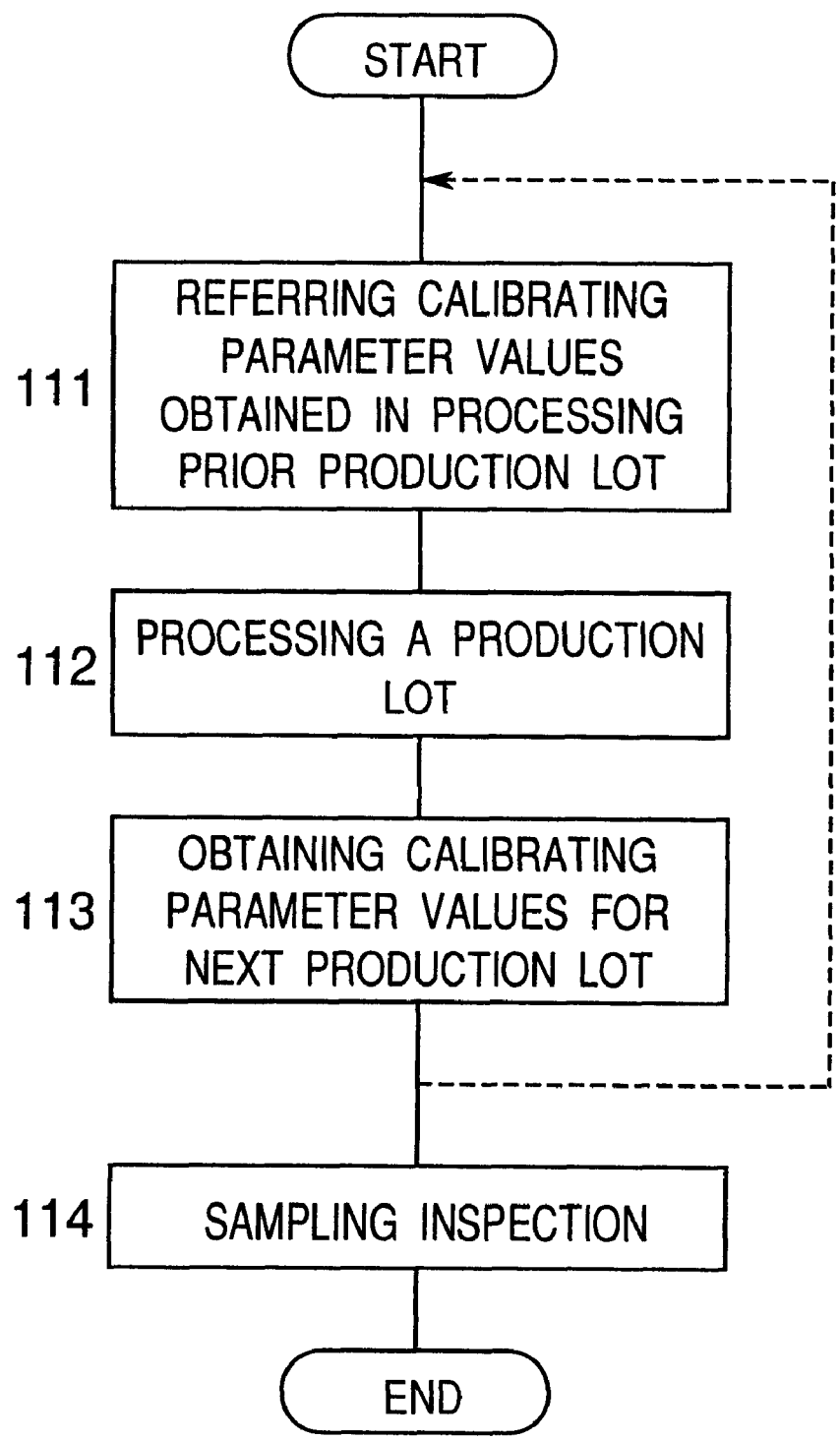
FIG. 6 is a flow chart of an another conventional photolithography process.

Referring to FIG. 4, the details of the photolithography process for the n-th production lot are described hereinafter. In step 41, the operator refers the host computer 1 through the terminal 2 to estimate the expected starting time to process the n-th production lot ($t = t_{n*}$). Also, in step 41, the operator calculates the life time period $T_n$ ($T_n = t_m - t_{n*}$) from the time ($t = t_m$) when the m-th calibrating parameter values are calculated to the expected starting time to process the n-th production lot ($t = t_{n*}$).

Similarly to the case of the m-th production lot, in step 42, in case where the m-th calibrating parameter values are determined not to be obsolete ($T_n < T_s$: in case of NO), in step 43, the n-th production lot is processed with the photolithography system compensated based upon the m-th calibrating parameter values. In step 44, a normal sampling inspection is conducted for the processed n-th production lot. Thus, a series of the photolithography process is completed.

On the other hand, in case where the m-th calibrating parameter values are determined to be obsolete ($T_n > T_s$: in case of YES), in step 45, three wafers in the n-th production lot are arbitrarily sampled.

Similarly to the case of the m-th production lot, the aforementioned predetermined time period $T_s$ such as the longest securing time period, and a time period $T_r$ necessary for the wafers to be recovered, are constant and to be, for example, 24 hours and 12 hours, respectively. Therefore, $T_s$ and $T_r$ presumably have a relation expressed in a following equation, i.e., $T_s = 2 \times T_r$, in step 42, the m-th calibrating parameter values may be determined to be obsolete, if $T_n > 2 \times T_r$. Further, the predetermined time period $T_s$ and the recovery time period $T_r$ may have a relation expressed in a following general equation, i.e., $T_s = k \times T_r$, while k can be calculated based upon the $T_s$ and $T_r$ of the sampled wafers. For example, if $T_s$ is 24 hours and $T_r$ is 6 hours, then k is 4. If k is calculated in advance, in step 42, the m-th calibrating parameter values may be determined to be obsolete, if $T_n > k \times T_s$.

In step 46, since the m-th calibrating parameter values are determined obsolete, they are updated to the n-th calibrating parameter values. In particular, the m-th lot sampled wafers stocked in step 26 are precedently processed to obtain the n-th calibrating parameter values. It is clear for the persons skilled in the art that the n-th calibrating parameter values should be obtained so that they are not obsolete at the time of the expected starting time for processing the n-th production lot ($t = t_{n*}$). Preferably, a series of the steps for obtaining the n-th calibrating parameter values should be started later as possible so as to be completed just before the expected starting time ($t = t_{n*}$) As described above, steps applied to the m-th production lot are similarly applied to the n-th production lot with one exception. That is, while the first lot samples have to be firstly recovered and again precedently processed to obtain the m-th calibrating parameter values in step 26, contrary to this, the m-th lot samples are only to be precedently processed without a need of the recovery, shortening the time to calculate the n-th calibrating parameter values in step 46.

In step 47, the m-th lot sampled wafers which were precedently processed to calculate the n-th calibrating parameter values are recovered and then incorporated into the n-th production lot. In step 48, the n-th production lot is processed with the photolithography system compensated by the n-th calibrating parameter values. In step 49, the actual starting time to process the n-th production lot (t=$t_n$) is stored in the host computer 1.

After the n-th production lot is processed, in step 50, a sampling test is conducted for the n-th production lot. In the normal sampling inspection, arbitrary several wafers are sampled, but according to the present invention, at least one of the wafers is sampled from the former m-th production lot for testing the n-th production lot. Thus, not only the wafers processed trough a normal process (without being precedently processed) but also the wafers processed through a special process (with being precedently processed) are evaluated to assure the quality. Thus, a series of photolithography process for the n-th production lot are completed.

The subsequent production lots after the n-th production lot are processed similarly to the way of the n-th production lot. When determined that the calibrating parameter values for a certain production lot should be updated, then some wafers are sampled from the production lot for updating the calibrating parameter values in future and some wafers which were kept at the time of the last updating of the calibrating parameter values are precedently processed to calculate a new set of the calibrating parameter values. Thus, off-wafers can be minimized in number.

Suppose, in general, if determined that an m-th calibrating parameter values (m is a natural number of more than 2) for processing a n-th production lot (n is a natural number of more than 3) should be updated, then some wafers which were sampled and kept at the last updating as m-th lot wafers are precedently processed to obtain a new set of n-th calibrating parameter values for processing the n-th and subsequent production lots. Also, some wafers are sampled from the n-th production lot and kept as n-th lot wafers for a while. Later, if determined that an n-th calibrating parameter values for processing a k-th production lot (k is a natural number of more than 4) should be updated, then the n-th lot wafers are precedently processed for obtaining k-th calibrating parameter values. If determined not, then the k-th production lot is processed with the photolithography system compensated based upon the n-th calibrating parameter values.

What is claimed is:

1. A photolithography process, in which a production lot having a plurality of semiconductor wafers is processed with a photolithography system compensated based upon calibrating parameter values obtained in a precedent process, comprising steps of:

a) precedently processing at least one of first lot wafers sampled from a first production lot so as to obtaining first calibrating parameter values;

b) calculating a time period ($T_m$) after obtaining the first calibrating parameter values until processing an m-th production lot (m is a natural number of more than 2);

c-1) if the time period ($T_m$) does not exceed a predetermined time period ($T_s$), processing the m-th production lot with the photolithography system compensated based upon the first calibrating parameter values; and c-2) if the time period ($T_m$) exceeds the predetermined time period ($T_s$), keeping at least one of m-th lot wafers sampled from the m-th production lot, precedently processing the first lot wafers again which is recovered so as to obtain m-th calibrating parameter values, and processing the m-th production lot with the photolithography system compensated based upon the m-th calibrating parameter values.

2. The photolithography process according to claim 1, wherein if the time period ($T_m$) exceeds the predetermined time period ($T_s$), the m-th production lot is processed with the photolithography system compensated based upon the m-th calibrating parameter values within the predetermined time period ($T_s$) after obtaining the m-th calibrating parameter values.

3. The photolithography process according to claim 1, if the time period ($T_m$) exceeds the predetermined time period ($T_s$), further comprising steps of:

twice recovering the first lot wafers; and incorporating the first lot wafers into the m-th production lot.

4. The photolithography process according to claim 3, further comprising a step of:

conducting a sampling inspection for the m-th production lot by sampling at least one of the former first lot samples which are incorporated into the m-th production lot.

5. A photolithography process according to claim 1, further comprising steps of:

d) calculating a time period ($T_n$) after obtaining the m-th calibrating parameter values until processing an n-th production lot (n is a natural number of more than 3);

e-1) if the time period ($T_n$) does not exceed the predetermined time period ($T_s$), processing the n-th production lot with the photolithography system compensated based upon the m-th calibrating parameter values; and e-2) if the time period ($T_n$) exceeds a predetermined time period ($T_s$), keeping at least one of n-th lot wafers sampled from the n-th production lot, precedently processing the m-th lot wafers so as to obtain n-th calibrating parameter values, and processing the n-th production lot with the photolithography system compensated based upon the n-th calibrating parameter values.

6. The photolithography process according to claim 5, wherein if the time period ($T_n$) exceeds the predetermined time period ($T_s$), the n-th production lot is processed with the photolithography system compensated based upon the n-th calibrating parameter values within the predetermined time period ($T_s$) after obtaining the n-th calibrating parameter values.

7. The photolithography process according to claim 5, if the time period ($T_n$) exceeds the predetermined time period ($T_s$), further comprising steps of:

recovering the m-th lot wafers; and incorporating the m-th lot wafers into the n-th production lot.

8. The photolithography process according to claim 7, further comprising a step of:

conducting a sampling inspection for the n-th production lot by sampling at least one of the former m-th lot samples which are incorporated into the n-th production lot.

9. A photolithography process, in which a production lot having a plurality of semiconductor wafers is processed with a photolithography system compensated based upon calibrating parameter values obtained in a precedent process, comprising steps of:

a) processing an n-th production lot (n is a natural number of more than 3) with a photolithography system compensated based upon n-th calibrating parameter values, which are obtained by precedently processing an m-th production lot (m is a natural number of more than 2)
b) keeping at least one of n-th lot wafers sampled from the n-th production lot;
c) calculating a time period ($T_k$) after obtaining the n-th calibrating parameter values until processing a k-th production lot (k is a natural number of more than 4);
d-1) if the time period ($T_k$) does not exceed a predetermined time period ($T_s$),
  processing the k-th production lot with the photolithography system compensated based upon the n-th calibrating parameter values; and
c-2) if the time period ($T_k$) exceeds the predetermined time period ($T_s$),
  keeping at least one of k-th lot wafers sampled from the k-th production lot,
  precedently processing the n-th lot wafers to obtain k-th calibrating parameter values, and
  processing the k-th production lot with the photolithography system compensated based upon the k-th calibrating parameter values.

10. The photolithography process according to claim 9, if the time period ($T_k$) exceeds the predetermined time period ($T_s$),
  wherein the k-th production lot is processed with the photolithography system compensated based upon the k-th calibrating parameter values within the predetermined time period ($T_s$) after obtaining the k-th calibrating parameter values.

11. The photolithography process according to claim 9, if the time period ($T_k$) exceeds the predetermined time period ($T_s$), further comprising steps of:
  recovering the n-th lot wafers; and
  incorporating the n-th lot wafers into the k-th production lot.

12. The photolithography process according to claim 11, further comprising a step of:
  conducting a sampling inspection for the k-th production lot by sampling at least one of the former n-th lot samples which are incorporated into the k-th production lot.

* * * * *